(12) United States Patent
Terashita (10) Patent No.: US 7,309,880 B2
(45) Date of Patent: Dec. 18, 2007

(54) DISPLAY APPARATUS AND METHOD FOR PRODUCING THE SAME

(75) Inventor: Shinichi Terashita, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/382,574

(22) Filed: Mar. 7, 2003

(65) Prior Publication Data
US 2003/0173892 A1    Sep. 18, 2003

(30) Foreign Application Priority Data
Mar. 18, 2002  (JP) ............................. 2002-073661

(51) Int. Cl.
*H01L 33/00* (2006.01)
(52) U.S. Cl. ........................... 257/98; 257/99; 257/59; 257/72; 385/15; 385/31; 385/33; 313/500; 313/503; 438/28; 438/29; 438/34; 438/99
(58) Field of Classification Search ................. 257/97, 257/98, 99, 94, 95, 96, 43, 44, 45; 349/71, 349/69, 159; 385/120, 121; 313/582; 438/28
See application file for complete search history.

(56) References Cited

U.S. PATENT DOCUMENTS

| | | | | |
|---|---|---|---|---|
| 5,231,049 | A * | 7/1993 | Neugebauer et al. | .......... 438/28 |
| 6,104,371 | A | 8/2000 | Wang et al. | |
| 6,195,196 | B1 * | 2/2001 | Kimura et al. | .............. 359/295 |
| 6,222,203 | B1 | 4/2001 | Ishibashi et al. | |
| 6,259,838 | B1 * | 7/2001 | Singh et al. | .................. 385/31 |
| 6,274,978 | B1 * | 8/2001 | Roach et al. | ................ 313/483 |
| 6,407,785 | B1 * | 6/2002 | Yamazaki | .................... 349/113 |
| 6,459,200 | B1 * | 10/2002 | Moore | .......................... 313/582 |
| 6,704,335 | B1 * | 3/2004 | Koyama et al. | .............. 372/43 |
| 7,082,236 | B1 * | 7/2006 | Moore | .......................... 385/33 |
| 2001/0055454 | A1 * | 12/2001 | Roach et al. | ................ 385/123 |
| 2002/0018628 | A1 * | 2/2002 | Kim et al. | ................... 385/120 |
| 2002/0031315 | A1 * | 3/2002 | Cheng et al. | ................ 385/120 |

FOREIGN PATENT DOCUMENTS

JP          55-57772 U          1/1980

(Continued)

OTHER PUBLICATIONS

AC John Currie; Jul. 2001; Nikkei Microdeivces, pp. 101-104 (With concise Explaniation of Relevance in English).

(Continued)

*Primary Examiner*—Sue A. Purvis
*Assistant Examiner*—Fazli Erdem
(74) *Attorney, Agent, or Firm*—Keating & Bennett, LLP (57) ABSTRACT

A display apparatus includes an array of fiber-type semiconductor light-emitting elements. Each of the fiber-type semiconductor light-emitting elements includes a layered structure having a first electrode layer, a second electrode layer, and a semiconductor light-emitting layer at least part of which is sandwiched by the first and second electrode layers, and a fiber for supporting the layered structure and for propagating light emitted from the light-emitting layer. The display apparatus also includes driving connectors including a switching element or a plurality of first and second conductive lines, which are electrically connected to the first and second electrode layers, respectively, for driving the plurality of the fiber-type semiconductor light-emitting elements.

22 Claims, 5 Drawing Sheets

FOREIGN PATENT DOCUMENTS

| | | |
|---|---|---|
| JP | 04-144085 A | 5/1992 |
| JP | 05-100318 | 4/1993 |
| JP | 07-037688 A | 2/1995 |
| JP | 07-078682 A | 3/1995 |
| JP | 10-083149 A | 3/1998 |
| JP | 2000-200679 A | 7/2000 |
| JP | 2000-242197 | 9/2000 |
| WO | WO 99/62126 | 12/1999 |

OTHER PUBLICATIONS

Ad K. Yoda et al; "Fabrication of Organic LED Fibers", http://pec.shinshu-u.ac.jp, (With English translation of the web page. (Last updated and accessed Jun. 2006).

Official communication issued in the corresponding Japanese Application No. 2002-073661, mailed on Dec. 12, 2006.

Official Communication issued in corresponding Japanese Patent Application No. 2002-073661, mailed Jul. 25, 2006.

* cited by examiner

DISPLAY APPARATUS AND METHOD FOR PRODUCING THE SAME

BACKGROUND OF THE INVENTION

1. Field of the Invention

The present invention relates to a display apparatus provided with an array of fiber-type semiconductor light-emitting elements, and a method for producing such a display apparatus. The present invention can be suitably utilized for a mobile information terminal, a personal computer, a word processor, an amusement apparatus, educational equipment, a television set, and other suitable display devices and apparatuses which are used by a number of persons, for example.

2. Description of the Related Art

Apparatuses for displaying images (pictures, data, or arrays of other two-dimensional information) fall into two broad categories: self-luminous type and non-luminous type. As a display apparatus of the self-luminous type, an apparatus (CRT or PDP) in which light and darkness of the luminous brightness are obtained by collisions of electrons and plasmas with phosphors by adjusting a voltage or a current have been commercialized. For the purpose of using such a display apparatus outdoors, a direct view apparatus having a much larger size in which a number of chips of light-emitting diodes (LED) are two-dimensionally arranged has been also practically used.

In the case of a display apparatus with such LED chips, the pixel pitches are larger than those of the CRT or PDP. For this reason, display apparatuses with a 30-inch to a 60-inch screen cannot realize high-definition display of XGA or more with full color. The reason why the pixel pitches are large is that the size of an LED chip functioning as a pixel is large, i.e., about several millimeters. As described above, even if the display apparatus with LED chips is suitable as a display apparatus of very large size disposed outdoors, it is difficult for a CRT or PDP to be substituted for such a display apparatus.

On the other hand, research and development of a self-luminous type display apparatus using organic EL materials or inorganic EL materials have constructively been performed. These display apparatuses are suitable for higher definition, but the size thereof cannot be easily increased.

SUMMARY OF THE INVENTION

In order to overcome the problems described above, preferred embodiments of the present invention provide a display apparatus suitable for higher definition with a self-luminous device such as LED, and a method for producing the display apparatus.

According to a preferred embodiment of the present invention, a display apparatus includes an array of fiber-type semiconductor light-emitting elements, each of the fiber-type semiconductor light-emitting elements including a layered structure having a first electrode layer, a second electrode layer, and a semiconductor light-emitting layer at least part of which is sandwiched by the first and second electrode layers, and a fiber for supporting the layered structure and for propagating light emitted from the light-emitting layer.

Each of the fiber-type semiconductor light-emitting elements preferably has a wave guide structure that enables light to be transmitted along a longitudinal axis thereof and to be emitted from an end surface of the light emitting fiber. The waveguide structure may include a core and a cladding structure surrounding the core such that light generated and emitted by the semiconductor light emitting element described above is propagated along the core to an end surface of the light emitting fiber. It is preferred that the core and the cladding layer are both transparent, but have different refractive indexes relative to each other such that the differences in refractive indexes provides the desired waveguide function for transmitting light from the end surface of the light emitting fiber.

The light emitting fiber may also have other waveguide structures such as a structure including a transparent fiber portion and a reflective layer, such as metal film, surrounding the transparent fiber portion. The transparent fiber portion can have a uniform refractive index. With this structure, light generated and emitted by the semiconductor light emitting element is confined by the outer reflective layer and propagates along the fiber. In this case, the reflective layer functions like a cladding layer described above.

The display apparatus also includes driving connectors for connecting the plurality of fiber-type semiconductor light-emitting elements to a driving device or circuit. The driving connector may include a plurality of first and second conductive lines connected to first and second electrode layers, respectively, or switching elements for selectively connecting at least one of the first and second electrode layers in the fiber-type semiconductor light-emitting element to a driving circuit.

The fiber-type semiconductor light-emitting elements are preferably arranged in a matrix of rows and columns. In such a configuration, each of the plurality of first conductive lines mutually connects the first electrode layers of a plurality of fiber-type semiconductor light-emitting elements belonging to a corresponding row, and each of the plurality of second conductive lines mutually connects the second electrode layers of a plurality of fiber-type semiconductor light-emitting elements belonging to a corresponding column. It is preferred that a pattern of conductive films functions as the first and second conductive lines. The pattern of conductive films may be formed on a substrate used to contain the fibers, as described later.

In the configuration using a switching element as the driving connector, it is preferred that the switching element is a thin film transistor that is formed as part of the layered structure of the fiber-type semiconductor light-emitting elements.

An end surface of the array of the fiber-type semiconductor light-emitting elements is preferably disposed in a position corresponding to a pixel.

Also, it is preferable that the layered structure is arranged around the fiber so as to surround the fiber.

In a preferred embodiment, the layered structure of each of the fiber-type semiconductor light-emitting elements includes a hole carrying layer, a light-emitting layer, and an electron carrying layer which are laminated on each other to form the layered structure.

The semiconductor light-emitting layer is preferably formed from a material which emits light selected from three primary colors of light, such that an end surface of the array of the fiber-type semiconductor light-emitting element can display a full-color image.

In another preferred embodiment, each of the fiber-type semiconductor light-emitting elements includes three kinds of semiconductor light-emitting layers for emitting light of three primary colors, respectively, such that an end surface of the array of the fiber-type semiconductor light-emitting elements can display a full-color image.

Alternatively, the semiconductor light-emitting layer may preferably be formed from a material which emits white light. In such a configuration, a color filter is disposed on an outside of an end surface of the array of the fiber-type semiconductor light-emitting elements.

In yet another preferred embodiment, the semiconductor light-emitting layer is preferably formed from a material which emits white light, and the fiber is provided with an element that functions as a color filter.

It is preferable that the fiber-type semiconductor light-emitting element is a light-emitting diode, but other structures and elements can be used for the fiber-type semiconductor light-emitting element. For example, the fiber-type semiconductor light-emitting element may also be a laser and may include a diffraction grating disposed on a surface of the fiber.

According to one preferred embodiment of the present invention, the display apparatus preferably includes at least one substrate including a plurality of opening portions through each of which a respective fiber is inserted. In such a configuration, it is preferred that each of the opening portions has an inner diameter that corresponds to an outer diameter of the fiber. The pattern of conductive films described above may preferably be formed on the substrate so as to define the plurality of first and second conductive lines defining the driving connector.

In an alternative preferred embodiment, the display apparatus includes a first substrate on which the plurality of first conductive lines extending in a first direction are disposed, and a second substrate on which the plurality of second conductive lines extending in a second direction intersecting the first direction are disposed.

It is preferred that the fiber is formed from a transparent material which transmits visible light such as quartz, glass or plastic.

According to another preferred embodiment of the present invention, a method for producing a display apparatus includes the steps of preparing a plurality of fiber-type semiconductor light-emitting elements, each of the plurality of fiber-type semiconductor light-emitting elements including a layered structure having a first electrode layer, a second electrode layer, and a semiconductor light-emitting layer sandwiched by the first and second electrode layers, and a fiber for supporting the layered structure and for propagating light emitted from the light-emitting layer, preparing at least one substrate having a plurality of opening portions through which the fiber-type semiconductor light-emitting elements are inserted, and forming driving connectors to be electrically connected to the first and second electrode layers of the fiber-type semiconductor light-emitting elements, and inserting the fiber-type semiconductor light-emitting elements into the opening portions of the at least one substrate.

It is preferred that the step of preparing the at least one substrate includes a step of forming a conductive film on the substrate to define a plurality of first and second conductive lines electrically connected to the plurality of first and second electrode layers, the conductive film blocking the opening portions of the substrate.

It is also preferable that the step of preparing the fiber-type semiconductor light-emitting elements includes a step of growing the light-emitting layer on the fiber while rotating the fiber, and/or, a step of growing the light-emitting layer on the fiber while rotating a deposition source of the respective light-emitting layer with respect to the fiber.

Other features, elements, steps, characteristics and advantages of the present invention will become more apparent from the following detailed description of preferred embodiments of the present invention with reference to the attached drawings.

BRIEF DESCRIPTION OF THE DRAWINGS

The foregoing summary as well as the following detailed description of preferred embodiments of the present invention will be better understood when read in conjunction with the attached drawings. For the purpose of illustrating the present invention, there is shown in the drawings various embodiments which are presently preferred. It should be understood, however, that the present invention is not limited to the precise arrangements and instrumentalities shown.

DETAILED DESCRIPTION OF PREFERRED EMBODIMENTS

Hereinafter, preferred embodiments of the inventive display apparatus will be described with reference to the accompanying drawings.

The display apparatus of the present invention preferably includes an array of fiber-type semiconductor light-emitting elements. The fiber-type semiconductor light-emitting elements are connected to a driving device or circuit through driving connectors, which may include conductive lines or switching elements connected to electrode layers of the respective fiber-type semiconductor light-emitting elements. The fiber-type semiconductor light-emitting elements preferably have a waveguide structure that allows light generated therein to be propagated along a length thereof and emitted from end surfaces of the fiber-type semiconductor light-emitting elements. In a preferred embodiment, end surfaces of the fiber-type semiconductor light-emitting elements are two-dimensionally arranged (i.e., in a matrix of rows and columns), when the end surfaces are viewed by a monitor. Arbitrary images are displayed by the light emitted from the respective end surfaces of the fiber-type semiconductor light-emitting elements.

Each of the fiber-type semiconductor light-emitting elements includes a fiber through which light can be transmitted (an optical fiber, for example) and a layered structure disposed on the fiber. The layered structure has various layers including a semiconductor light-emitting layer, and first and second electrode layers for causing a current to flow to the layers included in the layered structure. The first electrode layer and the second electrode layer function as an anode and a cathode, respectively, and the first and second electrode layers sandwich the semiconductor light-emitting layer at least along a portion thereof.

When an appropriate voltage is applied from a plurality of fiber-type semiconductor light-emitting elements arranged in an array to the first and second electrode layers of an arbitrarily selected light-emitting element, recombination is caused between a hole and an electron injected into a semiconductor light-emitting layer of the light-emitting element, thereby realizing emission of light having a desired wavelength band. The light emitted from the semiconductor light-emitting layer effectively propagates through the fiber, and typically radiates via the waveguide structure of the fiber and is emitted from one end surface of the fiber to the outside. The light emitted from the end surface of the fiber contributes to the display of images. The end surfaces of the fibers arranged in the array configuration function as pixels or picture elements, respectively. The method for emitting light from a fiber is not limited to this preferred embodiment. Alternatively, light may be emitted to the outside from a specified portion provided in a side surface of the fiber, and the light may be used for the display of images.

In the case where light-emitting surfaces of fibers (typically, "fiber end surfaces") are arranged in a matrix of rows and columns, light emission of the respective fiber-type semiconductor light-emitting elements is controlled by using a known driving circuit, so as to display a desired image.

When the display apparatus of a preferred embodiment of the present invention is configured to operate via passive driving, driving connectors including a plurality of first conductive lines respectively connected to the first electrode layers of the fiber-type semiconductor light-emitting elements and a plurality of second conductive lines respectively connected to the second electrode layers are electrically connected to a driving circuit, so that the light emission of the respective fiber-type semiconductor light-emitting elements can be controlled by the driving circuit. As the driving circuit, a known circuit used in a liquid crystal display apparatus, an organic EL display apparatus, or other suitable driving device or circuit can be used.

On the contrary, if a switching element such as a TFT, which defines a driving connector, is assigned to each fiber-type semiconductor light-emitting element, the display apparatus of another preferred embodiment of the present invention can be driven by active matrix driving. In such a case, if the switching element such as a TFT is provided on the fiber, processes of producing a display apparatus by using fiber-type semiconductor light-emitting elements can be simplified, and the size of the apparatus can be easily reduced.

The layered structure of the fiber-type semiconductor light-emitting element has a structure preferably functioning as an LED or a laser diode. A semiconductor light-emitting layer and the other layers are preferably formed from an organic material or an inorganic material appropriately selected in accordance with required characteristics such as a wavelength of emitted light. In order to form a semiconductor layer of good quality on a fiber, it is preferred that each layer is formed by using an organic EL material which will be described in detail later.

Hereinafter, specific preferred embodiments of the display apparatus of the present invention will be described with reference to the accompanying drawings.

First Preferred Embodiment

The first preferred embodiment will be described with reference to FIGS. 1, 2, 3, 4A, and 4B.

Figure 1:
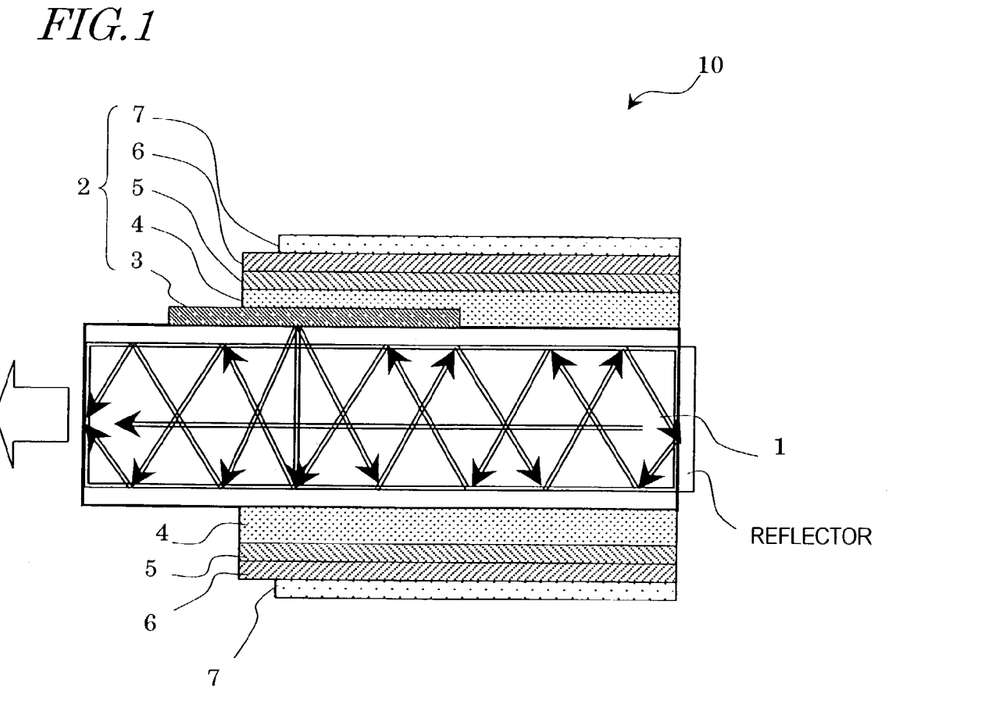
FIG. 1 is a sectional view illustrating part of a fiber-type semiconductor light-emitting element used in a display apparatus according to a preferred embodiment of the present invention.

The first preferred embodiment preferably includes a fiber-type semiconductor light-emitting element 10 as shown in FIG. 1. The fiber-type semiconductor light-emitting element 10 in FIG. 1 preferably includes a glass fiber 1 having a diameter of about 0.5 mm, and a layered structure 2 formed around the glass fiber 1 so as to surround the glass fiber 1. The layered structure 2 in FIG. 1 includes a first electrode layer (an anode) 3, a hole carrying layer 4, a light-emitting layer 5, an electron carrying layer 6, and a second electrode layer (a cathode) 7. In this preferred embodiment, the layered structure 2 constitutes an organic light-emitting diode (OLED).

The glass fiber 1 preferably has a wave guide structure that enables light to be transmitted along a longitudinal axis thereof and emitted from an end surface of the light emitting fiber 1. The waveguide structure may include a core and a cladding structure surrounding the core such that light generated and emitted by the semiconductor light emitting element described above is propagated along the core to an end surface of the light emitting fiber. It is preferred that the core and the cladding layer are both transparent, but have different refractive indexes relative to each other such that the differences in refractive indexes provides the desired waveguide function for transmitting light from the end surface of the light emitting fiber. For example, the glass fiber 1 is preferably constituted by a core portion with a relatively high refractive index, and a clad portion with a relatively low refractive index. The clad portion surrounds an outer circumference of the core portion. It is preferred that a coating for protection (not shown) be formed around the clad portion, but the coating is not necessarily required.

The light emitting fiber 1 may also have other waveguide structures such as a structure including a transparent fiber portion and a reflective layer, such as metal film, surrounding the transparent fiber portion. The transparent fiber portion can have a uniform refractive index. With this structure, light generated and emitted by the semiconductor light emitting element is confined by the outer reflective layer and propagates along the fiber. In this case, the reflective layer functions like a cladding layer described above.

As a fiber used in preferred embodiments of the present invention, an optical fiber which is usually used for optical communications may preferably be used. Alternatively, any other type of fiber can be used. The fiber in the present invention is not used for performing long-distance transmission of light signals. For this reason, it is unnecessary to rigorously limit the materials and the design of the structure of the fiber in view of problems such as transmission loss or dispersion. Therefore, it is possible to realize the display apparatus of various preferred embodiments of the present invention even if a fiber to be used has a configuration in which the circumference of a fiber-like member with uniform distribution of refractive index is covered with a reflection film or other suitable element, for example. Alternatively, instead of the glass fiber, a fiber made of another suitable material (a plastic fiber, for example) may be used.

The first electrode layer 3 of the light-emitting element in this preferred embodiment is preferably formed of an IZO ($IN_2O_3$-ZnO) layer, for example. The IZO layer is deposited around the fiber by RF sputtering, for example. The hole carrying layer 4 is preferably formed by a P-TPD (TPD-based polymer) layer, for example. The P-TPD layer is grown from an MDC solution by dipping. The light-emitting layer 5 and the second electrode layer 7 are preferably formed of an Alq3 layer and an MgAg layer, respectively. These layers can preferably be formed by vacuum evaporation while rotating the fiber.

In the case where the layered structure has a fiber shape, various films having substantially uniform thickness or characteristics in an axis direction of the fiber can be cylindrically deposited around the fiber. Therefore, it is easy to increase an effective area of the light-emitting area without increasing the outer diameter of the fiber. However, in the manufacturing process, it is preferable that a plurality of isolated light-emitting elements, each having a layered structure, are formed on a fiber having a sufficient length, and then the fiber is cut and separated into fiber-type semiconductor light-emitting elements having a predetermined length by a method described later. The layered structure is not uniformly formed in the axial direction of the fiber, but various device structures can be realized in various combinations of a plurality of layers having predetermined patterns. It is preferred that a step of patterning the film deposited on the fiber by photolithography and etching is performed to achieve the desired layered structure on the fiber.

Figure 2:
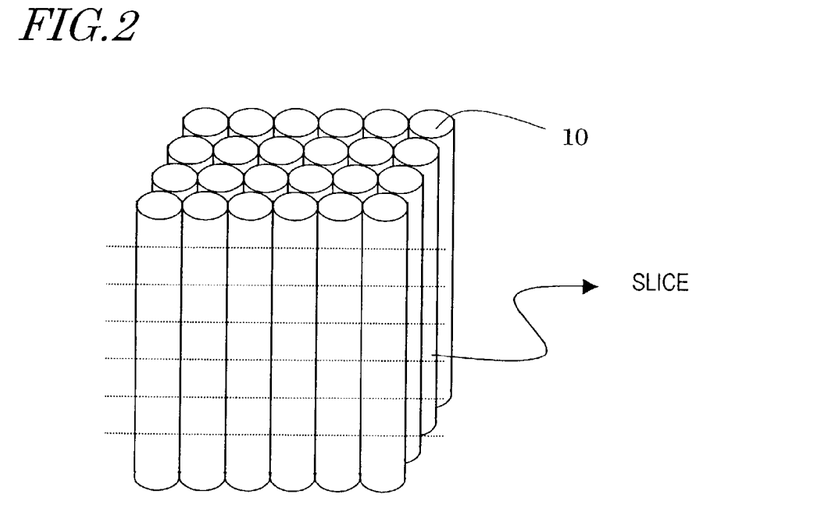
FIG. 2 is a perspective view illustrating an array of the fiber-type semiconductor light-emitting elements used in the display apparatus according to a preferred embodiment of the present invention.

FIG. 2 schematically shows an array of the fiber-type semiconductor light-emitting elements 10 used in the display apparatus of the present preferred embodiment. Each of the fiber-type semiconductor light-emitting elements 10 constituting the array preferably has the configuration described with reference to FIG. 1. In an example shown in FIG. 2, a number of fiber-type semiconductor light-emitting elements 10 are bundled, and mutual positional relationships are fixed by an adhesive or other suitable fixing element. For fixing by an adhesive, an adhesive polymer such as an epoxy resin may be preferably used.

The bundle of the fiber-type semiconductor light-emitting elements 10 shown in FIG. 2 is sliced, so as to be divided into a plurality of device blocks each having a predetermined length. The respective device blocks are used in combination with a substrate which will be described later, so as to constitute a display apparatus.

When a bundle of fiber-type semiconductor light-emitting elements 10 which are relatively long (which have a length of about 50 cm or more, for example) is to be divided into the above-described device blocks, the bundled fibers are preferably cut so as to have a predetermined length. The length of fiber-type semiconductor light-emitting element used for the display apparatus is typically set in the range of about several centimeters to about several tens of centimeters. In this preferred embodiment, after the longer fiber-type semiconductor light-emitting elements 10 are bundled, the fibers are cut to be short. Alternatively, after the fibers are cut to be short, a plurality of fibers in the cut condition may be bundled. Alternatively, the step of bundling the fibers is omitted, and individual fibers may be inserted into opening portions of the substrate which will be described later.

In the case where a glass fiber is used for the fiber-type semiconductor light-emitting element 10, a flaw may occur on a clad surface of the fiber by using a super hard blade of diamond, ceramics, or other material for performing the step of cutting the fibers. Thereafter, a bending stress is applied to the fiber, thereby cutting the fiber so that a surface that is substantially perpendicular to the fiber axis is exposed as a cut surface (an end surface). A grinding process may preferably be performed on the end surface of the fiber, so as to remove or correct a burr or a chip formed in the vicinity of the end surface during the cutting step.

On the contrary, in the case where a plastic fiber is used, after the cutting process, a finishing process of smoothing the cut surface (the end surface) of the fiber is performed, as necessary. The finishing process can be performed by grinding or hot plating. In the hot plating process, an end portion of the fiber is pressed against a heated metal mirror surface, so that the flatness of the metal mirror surface is transferred to the end surface of the fiber. In order to increase the luminance of the light emitted from the fiber, it is desired that the end surface of the fiber be smoothed. Alternatively, for other purposes, the end surface of the fiber may be processed so as to be concave or convex. Alternatively, a process of applying a property of light diffusion to the end surface of the fiber may be performed.

Figure 3A:
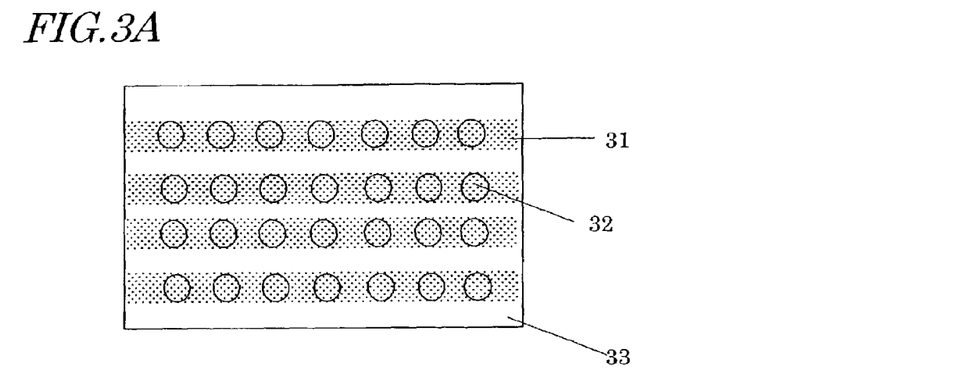
FIGS. 3A and 3B are plan views illustrating conductive line layouts of a substrate used in the display apparatus according to a preferred embodiment of the present invention.
Figure 3B:
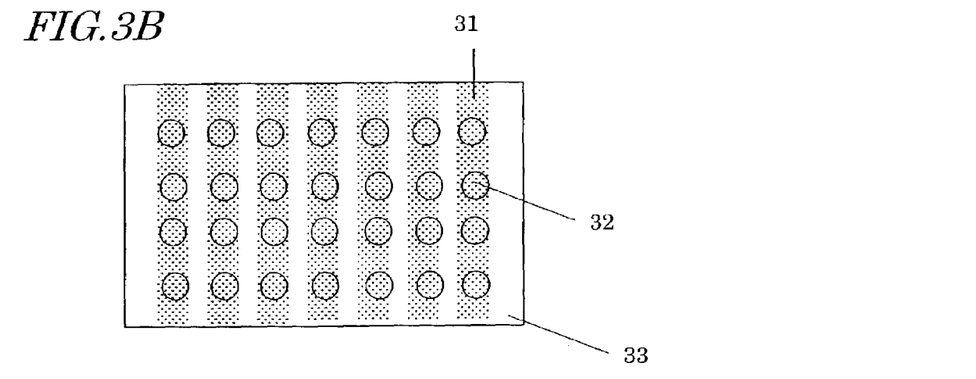

FIGS. 3A and 3B respectively show a substrate 33 in which a plurality of conductive lines (interconnects or driving connectors) 31 required for driving the fiber-type semiconductor light-emitting elements 10 are formed. In the substrate 33, opening portions (holes) 32 arranged in a matrix of rows and columns are formed. The fibers are inserted into the opening portions 32. Thus, each of the opening portions 32 has an inner diameter (about 0.5 mm, for example) that substantially corresponds to the outer diameter of the fiber. The conductive lines 31 on the substrate 33 shown in FIG. 3A are extended in a row direction. The conductive lines 31 on the substrate 33 shown in FIG. 3B are extended in a column direction. The conductive lines formed on the two substrates mutually intersect at right angles, so that passive-type driving can be performed.

A width of each conductive line 31 is preferably substantially equal to the inner diameter of each opening portion 32. Each conductive line 31 is electrically connected to the electrode layer 3 or 7 of the fiber-type semiconductor light-emitting element 10 inserted in the corresponding opening portion 32. Thus, the corresponding electrode layer 3 or 7 is connected to a driving circuit which is not shown. Before the fiber-type semiconductor light-emitting element 10 is inserted into the opening portion 32 of the substrate 33, the conductive line 31 is formed so as to block the opening portions 32 of the substrate 33. One end of each fiber-type semiconductor light-emitting element 10 is inserted into a corresponding opening portion 32 of the substrate 33, and the electrode layer 3 or 7 of the fiber-type semiconductor light-emitting element 10 becomes in contact with the conductive line 31 on the substrate 33, so that the electrical contact of the electrode layer 3 or 7 with the conductive line 31 can be ensured. In order to smoothly insert the fiber-type semiconductor light-emitting element 10 into the opening portion 32 of the substrate 33, an end portion opposite to the light-emitting end surface of the fiber may be sharpened.

Figures 4A, 4B:
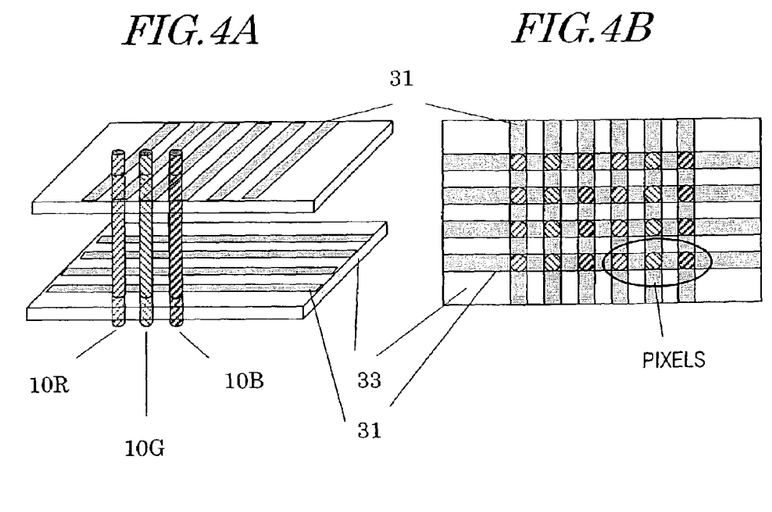
FIG. 4A is a perspective view illustrating a fundamental configuration in a first preferred embodiment of the display apparatus of the present invention.
FIG. 4B is a plan view schematically illustrating an arrangement of pixels in the display apparatus of FIG. 4A.

FIGS. 4A and 4B show structure in which three kinds of fiber-type semiconductor light-emitting elements 10R, 10G, and 10B corresponding to three primary colors of light R, G, and B are combined with the substrates 33 shown in FIGS. 3A and 3B, respectively. A light-emitting layer of the fiber-type semiconductor light-emitting element 10R for red may preferably be formed by using a combination of Alq3 (a host material) and dicyanoquinodimethane (a dopant material).

Similarly, a light-emitting layer of the fiber-type semiconductor light-emitting element 10G for green may preferably be formed by using a combination of Alq3 (host material) and quinacridon (a dopant material), and a light-emitting layer of the fiber-type semiconductor light-emitting element 10B for blue may preferably be formed by using a combination of distilallylene derivative (a host material) and styrylamine derivative (a dopant material).

In the case where the light-emitting layers are formed from inorganic compounds, ZnS:Mn for red, ZnS:TbOF for green, and SrS:Cu, SrS:Ag, or SrS:Ce for blue may be used, for example.

In the examples shown in FIGS. 4A and 4B, one pixel is preferably constituted by three fiber-type semiconductor light-emitting elements 10R, 10G, and 10B for R, G, and B. The driving of the respective fiber-type semiconductor light-emitting elements 10R, 10G, and 10B is performed by a driving circuit (not shown) connected to the conductive line 31 on the substrate 33. Gradation display is performed by time division in which duty ratio of light-emitting time is controlled.

The size of display screen, the pixel pitches, and other physical characteristics and features can be arbitrarily set. In an exemplary case where an XGA display with pixel pitches of 1024×3 (RGB)×768 is provided, pixels can be arranged at pitches of approximately 330 μm by using fibers each having an outer diameter of about 200 μm, for example.

Second Preferred Embodiment

Figure 5:
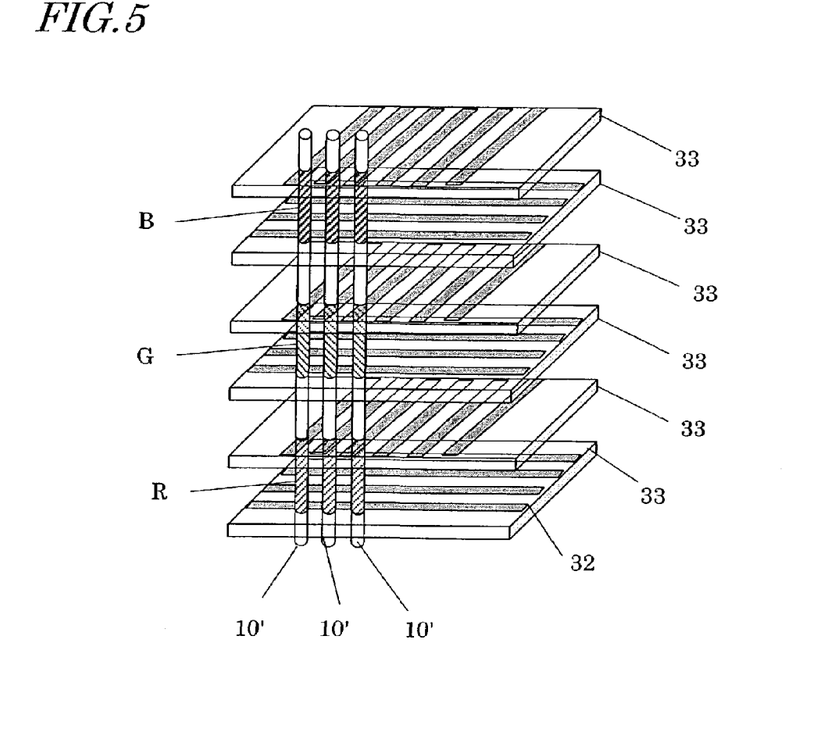
FIG. 5 is a perspective view illustrating a fundamental configuration in a second preferred embodiment of the display apparatus of the present invention.

Next, the second preferred embodiment of the present invention will be described with reference to FIG. 5.

In the first preferred embodiment shown in FIGS. 4A and 4B, three fiber-type semiconductor light-emitting elements 10R, 10G, and 10B for R, G, and B are preferably used for each pixel. In the second preferred embodiment, as shown in FIG. 5, a fiber-type semiconductor light-emitting element 10' preferably has three semiconductor light-emitting elements for R, G, and B disposed on one fiber. In the exemplary configuration shown in FIGS. 4A and 4B, three kinds of light emissions R, G, and B are generated on respectively different fibers. In the second preferred embodiment, light having full color can be obtained from one fiber-type semiconductor light-emitting element 10'. Accordingly, the definition can be three times as high in the second preferred embodiment as compared to that of the first preferred embodiment.

In the first preferred embodiment, the arranged pitches of the fiber-type semiconductor light-emitting elements 10 are large as compared with the fiber diameter. For this reason, in the case where a display apparatus of relatively large size is produced by using different fiber-type semiconductor light-emitting elements for R, G, and B, and an image is viewed in a position close to the screen, the pixel pitches may become so large that they cannot be ignored as compared with the spatial resolution of vision of a human being. In such a case, spatial mixing is not sufficiently achieved, and the color reproducibility may be disadvantageously deteriorated. However, in this preferred embodiment, light of a desired color is emitted from each fiber-type semiconductor light-emitting element 10', so that it is advantageous that the color reproducibility is not deteriorated, even if the pixel pitches are large (i.e., even if the pixels are coarsely arranged).

The three kinds of semiconductor light-emitting elements for R, G, and B on one fiber do not necessarily emit light always simultaneously. Alternatively, for the purpose of reducing the electric power consumption, or other purposes, light may be emitted in a time divisional manner. If the light emission of R, G, and B is performed in an appropriate field cycle, color reproduction sufficient for eyes of a human being can be realized.

Third Preferred Embodiment

Figure 6:
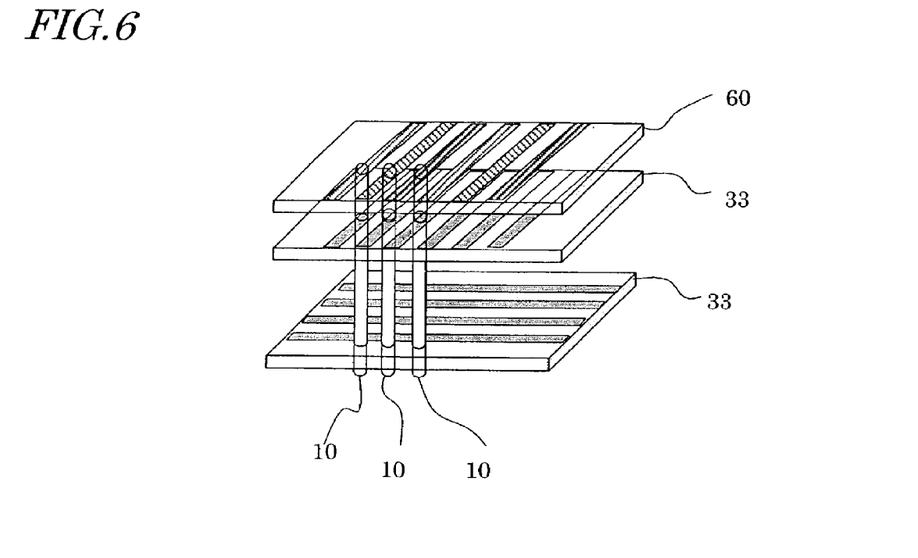
FIG. 6 is a perspective view illustrating a fundamental configuration in a third preferred embodiment of the display apparatus of the present invention.

Next, the third preferred embodiment of the present invention will be described with reference to FIG. 6.

Each fiber-type semiconductor light-emitting element 10 used in a display apparatus of this preferred embodiment can emit white color. In order to obtain a color image from white light, a color filter 60 is disposed on the light-emitting side in this preferred embodiment.

In the case where such a white light-emitting layer is formed from a macro molecular material, a red, green, or blue fluorescence dye may be dispersed in poly(N-vinylcarbazole) (PVK) as a host material, for example. In order to increase luminous efficiency, it is preferred that polyalkylthiophene derivative which is a conductive polymer be used for a buffer layer on an anode side, and a cesium metal be used as an electron injecting layer on a cathode side.

On the contrary, in the case where the white light-emitting layer is formed from a low molecular material, a ZnBTZ complex may be used, for example. Alternatively, a lamination of TPD (aromatic diamine)/p-EtTAZ (1,2,4-triazole derivative)/Alq may be used.

In the case where the white light-emitting layer is formed from an inorganic material, the white light can be obtained by mixing blue light emitted from a ZnSe-based light-emitting layer with light (green to red) emitted from a ZnSe substrate, for example.

In the above-described example, a conductive line 31 on a substrate 33 is directly connected to an electrode layer 3 or 7 of the fiber-type semiconductor light-emitting element 10. Alternatively, a switching element such as a TFT may be disposed between the conductive line 31 and the electrode layer 3 or 7. In this preferred embodiment, the color filter is preferably disposed on the outside of the end surface of the fiber. Alternatively, a filtering function may be added to the fiber. When an appropriate impurity or pigment is mixed into the fiber so as to absorb light of a specified wavelength band, the fiber functions as a color filter. Thus, it is unnecessary to additionally provide and arrange a color filter.

In this preferred embodiment, a color filter substrate may preferably be used. Alternatively, another type of optical film (a light scattering sheet, for example) may be appropriately used together with the color filter substrate.

Fourth Preferred Embodiment

Next, the fourth preferred embodiment of the present invention will be described with reference to FIG. 7.

Figure 7:
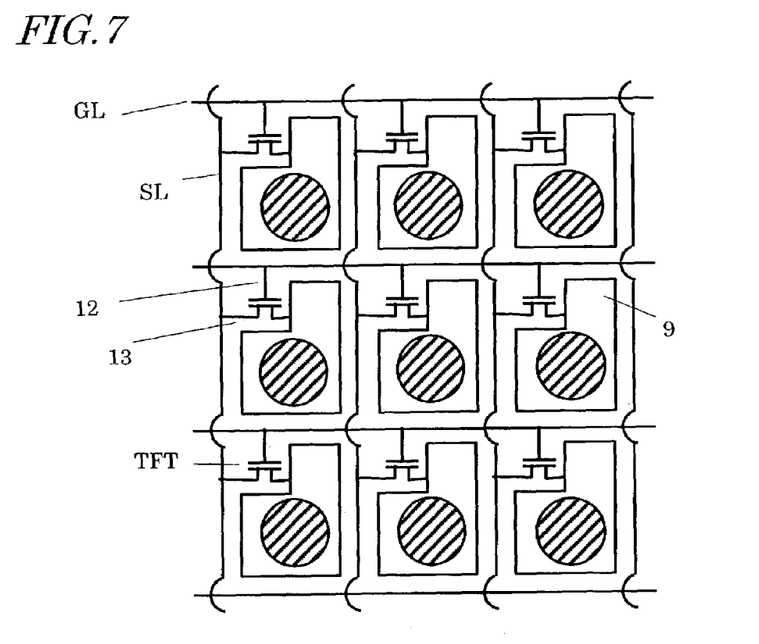
FIG. 7 is a schematic plan view showing a layout of an active matrix substrate used in a fourth preferred embodiment of the display apparatus of the present invention.

FIG. 7 shows a layout configuration of an active matrix substrate used in this preferred embodiment. In this preferred embodiment, in order to perform active matrix driving, two kinds of conductive lines (a gate bus line and a source bus line) and a TFT are preferably formed on the substrate.

A gate electrode 12 of each TFT formed on the active matrix substrate shown in the figure is connected to a corresponding gate bus line GL, and a source electrode 13 is connected to a corresponding source bus line SL. The TFT switches between conductive and non-conductive states in accordance with the level of a gate signal applied to the gate bus line GL. When the TFT is in the conductive state, an electric potential on the source bus line SL is applied to a second electrode layer 7 of a fiber-type semiconductor light-emitting element 10 via a drain electrode 9. The gate bus line GL and the source bus line SL are respectively connected to driving circuits (a source driver or a gate driver) which are not shown.

Figure 8:
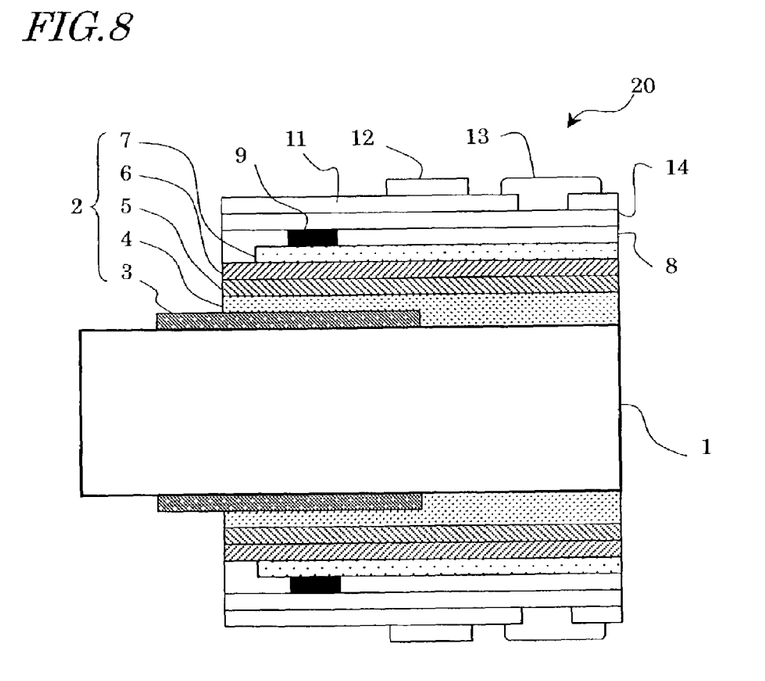
FIG. 8 is a sectional view illustrating part of a fiber-type semiconductor light-emitting element with which a switching element is integrated in the fourth preferred embodiment of the display apparatus of the present invention.

FIG. 8 shows a sectional configuration of a fiber-type semiconductor light-emitting element 20 in which the above-described TFT is not formed on a substrate, but on a fiber. In the example shown in FIG. 8, the configuration for TFT is added to the configuration of the fiber-type semiconductor light-emitting element 10 shown in FIG. 1. Specifically, the configuration includes a layer insulation film the second electrode layer 7, a drain electrode 9 which is in contact with the second electrode layer 7 via an opening portion of the layer insulation film 8, an organic semiconductor layer 14 formed on the layer insulation film 8, a gate insulation film 11 formed on the organic semiconductor layer 14, a gate electrode 12 formed on the gate insulation film 11, and a source electrode 13 which is in contact with the organic semiconductor layer 14 in a region where the gate electrode 12 is not located.

In the configuration shown in FIG. 8, the second electrode layer 7 is electrically in contact with the drain electrode 9. In accordance with the electrical potential applied from the gate electrode 12 to the organic semiconductor layer 14, a conductive channel is formed between the drain electrode 9 and the source electrode 13. As a result, a desired electrical potential is applied from a TFT connected to the selected gate bus line GL to the second electrode layer 7, so that a current flows between the first electrode layer 3 and the second electrode layer 7. Thus, light required for the display is generated in the light-emitting layer 5, and the light propagates through the fiber 1.

In this preferred embodiment, three substrates shown in FIG. 3 are preferably prepared. In each of the substrates, a conductive line connected to the first electrode layer 3, a gate bus line connected to the gate electrode 12, and a source bus line connected to the source electrode 13 are formed. It is understood that the first electrode layer 3 is a common electrode which is common to the respective light-emitting elements, so that it is unnecessary to have a pattern which is divided into a plurality of portions as in the conductive line 31 shown in FIG. 3.

When the fiber-type semiconductor light-emitting element 20 is inserted into an opening portion of each substrate, the electrode on the fiber and the conductive line on the substrate are mutually connected. Accordingly, a circuit similar to the circuit shown in FIG. 7 is formed, so that it is possible to perform active matrix driving.

It is preferred that the gate electrode 12 and the source electrode 13 are arranged in a ring manner around the fiber, similarly to the first electrode layer 3. With such a configuration, a contact area with the conductive line on the substrate is increased, so that a contact resistance is reduced. Moreover, a channel width of a transistor is increased, so that the driving force is increased. An inner diameter of the opening portion formed in each substrate is appropriately set in accordance with an outer diameter of the electrode layer which is arranged in a ring manner.

In this preferred embodiment, one switching element such as a TFT is preferably disposed on one fiber. Alternatively, the number of switching elements assigned to one light-emitting element may be two or more. In the display apparatus having a configuration shown in FIG. 5, for example, six (=2×3) or more switching elements may be disposed on one fiber.

The configuration in which the switching elements such as TFTS are formed on the fiber is arbitrarily selected. For example, a cylindrical semiconductor layer may be separated into a plurality of portions which are symmetric with respect to the axis, and a plurality of TFTS are arranged on the same circumference. Alternatively, the respective switching elements disposed on the same fiber may be connected, so as to constitute a circuit having some function. In such a case, a conductive line for mutually connecting the switching elements is preferably also formed on the fiber.

Fifth Preferred Embodiment

Next, the fifth preferred embodiment of the present invention will be described with reference to FIG. 9.

Figure 9:
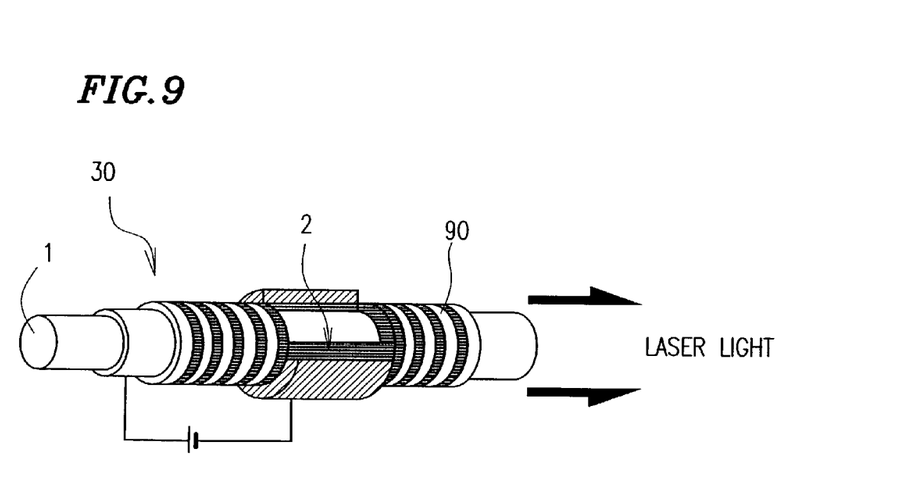
FIG. 9 is a view illustrating part of a fiber-type semiconductor light-emitting element which emits laser light from an end surface thereof in a fifth preferred embodiment of the display apparatus of the present invention.

A display apparatus of this preferred embodiment is constituted by using a fiber-type semiconductor light-emitting element 30 shown in FIG. 9. The fiber-type semiconductor light-emitting element 30 preferably includes a grating (diffraction grating) 90 for forming a resonator structure required for laser oscillation on a fiber.

The fiber-type semiconductor light-emitting element 30 in FIG. 9 has a structure, similar to the fiber-type semiconductor light-emitting element 10 in FIG. 1, in which a first electrode layer, a hole carrying layer, a light-emitting layer, an electron carrying layer, and a second electrode layer are layered on the fiber in this order. When a voltage of a threshold value or more is applied across the first electrode and a second electrode, laser light emitted from the light-emitting layer and oscillating in the resonator is combined in the fiber, and then the laser light is radiated from an end surface of the fiber. By adjusting the grating period of the grating 90 formed on the fiber, the oscillating wavelength of laser can be selected to within a predetermined range. The grating 90 is produced in the following manner. After an interference pattern is formed by using optical interference with respect to a photo resist applied on the fiber, etching for the fiber surface is performed.

The fabrication of the layered structure of the fiber-type semiconductor light-emitting element 30 in FIG. 9 can be performed in the following manner, for example. First, a fiber with a surface on which an ITO film (an anode layer) having a thickness of, for example, about 150 nm is provided is prepared, and the fiber is washed for approximately 30 seconds using oxygen plasma. Next, on the ITO film, copoly[3,3'-hydroxytetraphenylebenzidine/diethyleneglycol]carbonate is deposited as a hole carrying material, thereby forming a hole carrying layer having a thickness of about 220 nm. Thereafter, diaminodistyrylbenzene (DADSB) as an organic pigment material is deposited in a vacuum on the hole carrying layer. Next, a light-emitting layer having a thickness of about 100 nm is formed. Moreover, an oxadiazole (OXD) derivative is deposited in a vacuum, so that an electron carrying layer having a thickness of about 240 nm is formed. On the electron carrying layer, a Mg.Ag alloy is deposited in a vacuum, and a cathode layer having a thickness of about 200 nm is formed. The refractive index of the hole carrying layer formed by the above-described method is about 1.75, the refractive index of the light-emitting layer is about 2.11, and the refractive index of the electron carrying layer is about 1.93.

Next, a solution in which copoly[3,3'-hydroxytetraphenylbenzidine/diethylene glycol]carbonate of about 50 mg and the above-mentioned tris(4-bromophenyl) ammonium hexachloroantimonate (TBAHA) of 5 mg are dissolved in dichloromethane of approximately 1 mL is spin coated at revolution of about 1000 rpm. Then, heating is performed at 80° C. for about 1 hour, so as to remove solvent, thereby forming a hole carrying layer having a film thickness of approximately 650 nm.

The configuration and the manufacturing method of the fiber-type semiconductor light-emitting element 30 used in this preferred embodiment are not limited to the above-described examples.

When a display apparatus is constituted by using the fiber-type semiconductor light-emitting element 30 which performs laser oscillation, high luminance can be realized with low power consumption. In addition, instead of direct view type, the display apparatus can be used as a display apparatus of a projection type.

According to the display apparatus of various preferred embodiments of the present invention, the display is performed by using an array of fiber-type semiconductor light-emitting elements, so that high luminance and high visibility can be realized with a relatively simple construction and with low power consumption.

In preferred embodiments of the present invention, the layered structure for light emission is preferably provided on the fiber, so that it is easy to enlarge an area of effective light-emitting region of the light-emitting layer, and high luminance can be easily realized without reducing the degree of integration. Especially, the present invention can be applied to the projection type display apparatus in which laser oscillation is performed in light-emitting elements.

The fiber-type semiconductor light-emitting element used in preferred embodiments of the present invention can be designed and modified during the production process, so that it is superior in quantity production, and the handling is easy. The length can be freely set by cutting the fiber, so that it is possible to apply various formations to the display device.

While the present invention has been described with reference to various preferred embodiments thereof, it will be apparent to those skilled in the art that the disclosed invention may be modified in numerous ways and may assume many embodiments other than those specifically set out and described above. Accordingly, it is intended that the appended claims cover all modifications of the present invention which fall within the true spirit and scope of the invention.

What is claimed is:

1. A display apparatus comprising:
an array of fiber-type semiconductor light-emitting elements, each of the fiber-type semiconductor light-emitting elements including a layered structure having a first electrode layer, a second electrode layer, and a semiconductor light-emitting layer at least part of which is sandwiched by the first and second electrode layers, and a fiber for supporting the layered structure and for propagating light emitted from the light-emitting layer; and
a plurality of driving connectors electrically connected to at least one of the plurality of first and second electrode layers for connecting the array of fiber-type semiconductor light-emitting elements to a driving circuit, the plurality of driving connectors including a plurality of first conductive lines electrically connected to the first electrode layers and a plurality of second conductive lines electrically connected to the second electrode layers; wherein
the fiber-type semiconductor light-emitting elements are arranged in a matrix of rows and columns, each of the plurality of first conductive lines mutually connecting the first electrode layers of a plurality of fiber-type semiconductor light-emitting elements belonging to a corresponding row, and each of the plurality of second conductive lines mutually connecting the second electrode layers of a plurality of fiber-type semiconductor light-emitting elements belonging to a corresponding column; and
the fiber of each of the fiber-type semiconductor light-emitting elements has a waveguide structure that allows light therein to be propagated along a length thereof and emitted from end surfaces of the fiber-type semiconductor light-emitting elements.

2. The display apparatus of claim 1, wherein the plurality of driving connectors includes a plurality of switching elements electrically connected to at least one of the plurality of first electrode layers and the plurality of second electrode layers.

3. The display apparatus of claim 2, wherein each of the plurality of switching elements is a thin film transistor included in the layered structure.

4. The display apparatus of claim 1, wherein an end surface of the array of the fiber-type semiconductor light-emitting elements is disposed in a position corresponding to a pixel.

5. The display apparatus of claim 1, wherein the semiconductor light-emitting layer is formed from a material which emits light selected from three primary colors of light such that an end surface of the array of the fiber-type semiconductor light-emitting elements is capable of displaying a full-color image.

6. The display apparatus of claim 1, wherein each of the fiber-type semiconductor light-emitting elements includes three kinds of semiconductor light-emitting layers for emitting light of three primary colors, respectively such that an end surface of the array of the fiber-type semiconductor light-emitting elements is capable of displaying a full-color image.

7. The display apparatus of claim 1, wherein the semiconductor light-emitting layer is made of a material which emits white light, and a color filter is disposed outside of an end surface of the array of the fiber-type semiconductor light-emitting elements.

8. The display apparatus of claim 1, wherein the semiconductor light-emitting layer is made of a material which emits white light, and the fiber is provided with an element that functions a color filter.

9. The display apparatus of claim 1, wherein the fiber-type semiconductor light-emitting element is a light-emitting diode.

10. The display apparatus of claim 1, wherein the fiber-type semiconductor light-emitting element is a laser.

11. The display apparatus of claim 1, further comprising at least one substrate including a plurality of opening portions through each of which a respective one of the fibers is inserted, each of the opening portions having an inner diameter that substantially corresponds to an outer diameter of the respective fiber.

12. The display apparatus of claim 11, wherein the driving connectors include a pattern of conductive films disposed on the substrate.

13. The display apparatus of claim 1, further comprising a first substrate on which the plurality of first conductive lines extending in a first direction are provided, and a second substrate on which the plurality of second conductive lines extending in a second direction intersecting the first direction are provided.

14. The display apparatus of claim 1, wherein the fiber is made of a transparent material which transmits visible light.

15. The display apparatus of claim 14, wherein the transparent material is one of quartz, glass and plastic.

16. A method for producing a display apparatus comprising the steps of:
- preparing a plurality of fiber-type semiconductor light-emitting elements, each of the plurality of fiber-type semiconductor light-emitting elements including a layered structure having a first electrode layer, a second electrode layer, and a semiconductor light-emitting layer sandwiched by the first and second electrode layers, and a fiber for supporting the layered structure and for propagating light emitted from the light-emitting layer;
- forming a bundle of the plurality of fiber-type semiconductor light-emitting elements in a desired arrangement;
- preparing at least one substrate having a plurality of opening portions;
- inserting the fiber-type semiconductor light-emitting elements into the opening portions of the at least one substrate; and
- forming a conductive film on the at least one substrate such that the conductive film blocks the opening portions of the at least one substrate.

17. The method according to claim 16, wherein the step of forming the bundle includes the step of adhering the plurality of fiber-type semiconductor light-emitting elements to each other in the desired arrangement.

18. The method according to claim 16, further comprising the step of forming a plurality of conductive lines on the at least one substrate such that the plurality of conductive lines are electrically connected to the first and second electrode layers of the fiber-type semiconductor light-emitting elements.

19. The method according to claim 16, further comprising the step of forming a plurality of driving connectors so as to be electrically connected to at least one of the plurality of first electrode layers and the plurality of second electrode layers.

20. The method according to claim 19, wherein the plurality of driving connectors comprise one of a plurality of switching devices and a plurality of conductive lines.

21. A method for producing a display apparatus comprising the steps of:
- preparing a plurality of fiber-type semiconductor light-emitting elements, each of the plurality of fiber-type semiconductor light-emitting elements including a layered structure having a first electrode layer, a second electrode layer, and a semiconductor light-emitting layer sandwiched by the first and second electrode layers, and a fiber for supporting the layered structure and for propagating light emitted from the light-emitting layer; and
- forming a bundle of the plurality of fiber-type semiconductor light-emitting elements in a desired arrangement; wherein
  - the step of preparing the fiber-type semiconductor light-emitting elements includes at least one of a step of growing the light-emitting layer on the fiber while rotating the fiber, and a step of growing the light-emitting layer on the fiber while rotating a deposition source of the respective light-emitting layer with respect to the fiber.

22. A method for producing a display apparatus comprising the steps of:
- preparing a plurality of fiber-type semiconductor light-emitting elements, each of the plurality of fiber-type semiconductor light-emitting elements including a layered structure having a first electrode layer, a second electrode layer, and a semiconductor light-emitting layer sandwiched by the first and second electrode layers, and a fiber for supporting the layered structure and for propagating light emitted from the light-emitting layer;
- providing a plurality of driving connectors electrically connected to at least one of the plurality of first and second electrode layers for connecting the plurality of fiber-type semiconductor light-emitting elements to a driving circuit, the plurality of driving connectors including a plurality of first conductive lines electrically connected to the first electrode layers and a plurality of second conductive lines electrically connected to the second electrode layers; and
- forming a bundle of the plurality of fiber-type semiconductor light-emitting elements in a matrix of rows and columns, each of the plurality of first conductive lines mutually connecting the first electrode layers of a plurality of fiber-type semiconductor light-emitting elements belonging to a corresponding row, and each of the plurality of second conductive lines mutually connecting the second electrode layers of a plurality of fiber-type semiconductor light-emitting elements belonging to a corresponding column; wherein
- the fiber of each of the fiber-type semiconductor light-emitting elements has a waveguide structure that allows light therein to be propagated along a length thereof and emitted from end surfaces of the fiber-type semiconductor light-emitting elements.

* * * * *